United States Patent
Khanna et al.

(10) Patent No.: US 8,913,412 B1
(45) Date of Patent: Dec. 16, 2014

(54) INCREMENTAL ADAPTIVE MATCH LINE CHARGING WITH CALIBRATION

(75) Inventors: Sandeep Khanna, Los Altos, CA (US); Bindiganavale S. Nataraj, Cupertino, CA (US); Varadarajan Srinivasan, Los Altos Hills, CA (US)

(73) Assignee: Netlogic Microsystems, Inc., Irvine, CA (US)

( * ) Notice: Subject to any disclaimer, the term of this patent is extended or adjusted under 35 U.S.C. 154(b) by 44 days.

(21) Appl. No.: 13/306,896

(22) Filed: Nov. 29, 2011

(51) Int. Cl.
   *G11C 15/04* (2006.01)
(52) U.S. Cl.
   USPC ...................................... 365/49.17
(58) Field of Classification Search
   None
   See application file for complete search history.

(56) References Cited

U.S. PATENT DOCUMENTS

| | | | |
|---|---|---|---|
| 5,621,677 A | 4/1997 | Jones | |
| 6,125,049 A | 9/2000 | Nataraj | |
| 6,166,939 A | 12/2000 | Nataraj et al. | |
| 6,191,969 B1 | 2/2001 | Pereira | |
| 6,191,970 B1 * | 2/2001 | Pereira | 365/49.1 |
| 6,243,280 B1 | 6/2001 | Wong et al. | |
| 6,430,074 B1 | 8/2002 | Srinivasan | |
| 6,515,884 B1 * | 2/2003 | Sywyk et al. | 365/49.15 |
| 6,804,133 B1 | 10/2004 | Khanna | |
| 7,050,318 B1 | 5/2006 | Argyres | |
| 7,095,674 B2 | 8/2006 | Spix et al. | |
| 7,113,415 B1 | 9/2006 | Khanna | |
| 7,800,930 B1 * | 9/2010 | Deshpande et al. | 365/49.17 |
| 7,852,652 B1 | 12/2010 | Fabry | |
| 7,920,398 B1 | 4/2011 | Khanna et al. | |
| 8,089,794 B1 | 1/2012 | Deshpande et al. | |
| 2008/0259667 A1 * | 10/2008 | Wickeraad | 365/49.1 |

* cited by examiner

*Primary Examiner* — James G Norman
(74) *Attorney, Agent, or Firm* — Sterne, Kessler, Goldstein & Fox P.L.L.C.

(57) ABSTRACT

A content addressable memory (CAM) device having any number of rows, each of the rows including a match line connected to a plurality of CAM cells, a match line detector circuit, and an incremental match line charge circuit. The detector circuit generates a feedback signal based on a detected match line voltage. The charge circuit partially pre-charges the match line to an intermediate voltage during a pre-charge phase of a compare operation, and then selectively charges the match line higher towards a supply voltage in response to the feedback signal.

30 Claims, 9 Drawing Sheets

US 8,913,412 B1

INCREMENTAL ADAPTIVE MATCH LINE CHARGING WITH CALIBRATION

TECHNICAL FIELD

The present disclosure relates generally to content addressable memories and specifically to reducing power consumption of content addressable memories.

BACKGROUND OF RELATED ART

A content addressable memory (CAM) device is a storage device having an array of memory cells that can be instructed to compare the specific pattern of a comparand word or search key with data words stored in corresponding rows of the array. During a compare operation, the comparand word is provided to the CAM array and compared with all the CAM words. For each CAM word that matches the comparand word, a corresponding match line is asserted to indicate the match result. If any of the match lines are asserted, a match flag is asserted to indicate the match condition, and a priority encoder determines the match address or index of the highest priority matching entry in the CAM array.

Typically, the match lines of the CAM array are pre-charged (e.g., to a logic high state indicative of a logic "1" value) prior to the compare operation. During the compare operation, if all CAM cells in a row match the comparand data, the CAM cells do not discharge the row's match line, which remains in its charged state to indicate a match condition for the row. Conversely, if any CAM cell in the row does not match the comparand data, the CAM cell discharges the match line (e.g., to a logic low state indicative of a logic "0" value) to indicate a mismatch condition for the row. The discharged match lines are pre-charged to the supply voltage for the next compare operation.

Variations in operating conditions (e.g., temperature) and/or load may cause the voltage level of the pre-charged match lines to undesirably fluctuate. To account for such fluctuations, the match lines are typically pre-charged to a high voltage level to ensure that the voltage of the pre-charged match lines remains at or above a detectable threshold level (e.g., so that match latches coupled to the match lines can readily distinguish between a match condition and a mismatch condition during compare operations). However, this typically requires pre-charging the match lines to a full rail voltage (e.g., to the supply voltage), and may result in significant power consumption. Indeed, pre-charging the match lines to a lesser voltage to achieve power savings can undesirably lead to erroneous match results because the match line voltage of one or more matching CAM rows may not be sufficient to be detected as a match condition. Further, because the match line of each row of CAM cells that does not match the search key during a compare operation is discharged low towards ground potential to indicate the mismatch condition, the match lines of all such mismatching CAM rows are then pre-charged from ground potential back to the full pre-charge level for the next compare operation. Alternately charging and discharging all match lines that have a mismatch condition during compare operations may result in significant power consumption. This power consumption increases as the size and/or density of the CAM array increases and, therefore, undesirably limits the memory size and the scalability of the CAM array. Thus, it would be desirable to reduce the power consumption associated with charging the match lines of a CAM array for compare operations.

BRIEF DESCRIPTION OF THE DRAWINGS

The present embodiments are illustrated by way of example and not intended to be limited by the figures of the accompanying drawings, where.

Like reference numerals refer to corresponding parts throughout the drawing figures.

DETAILED DESCRIPTION

Figure 1:
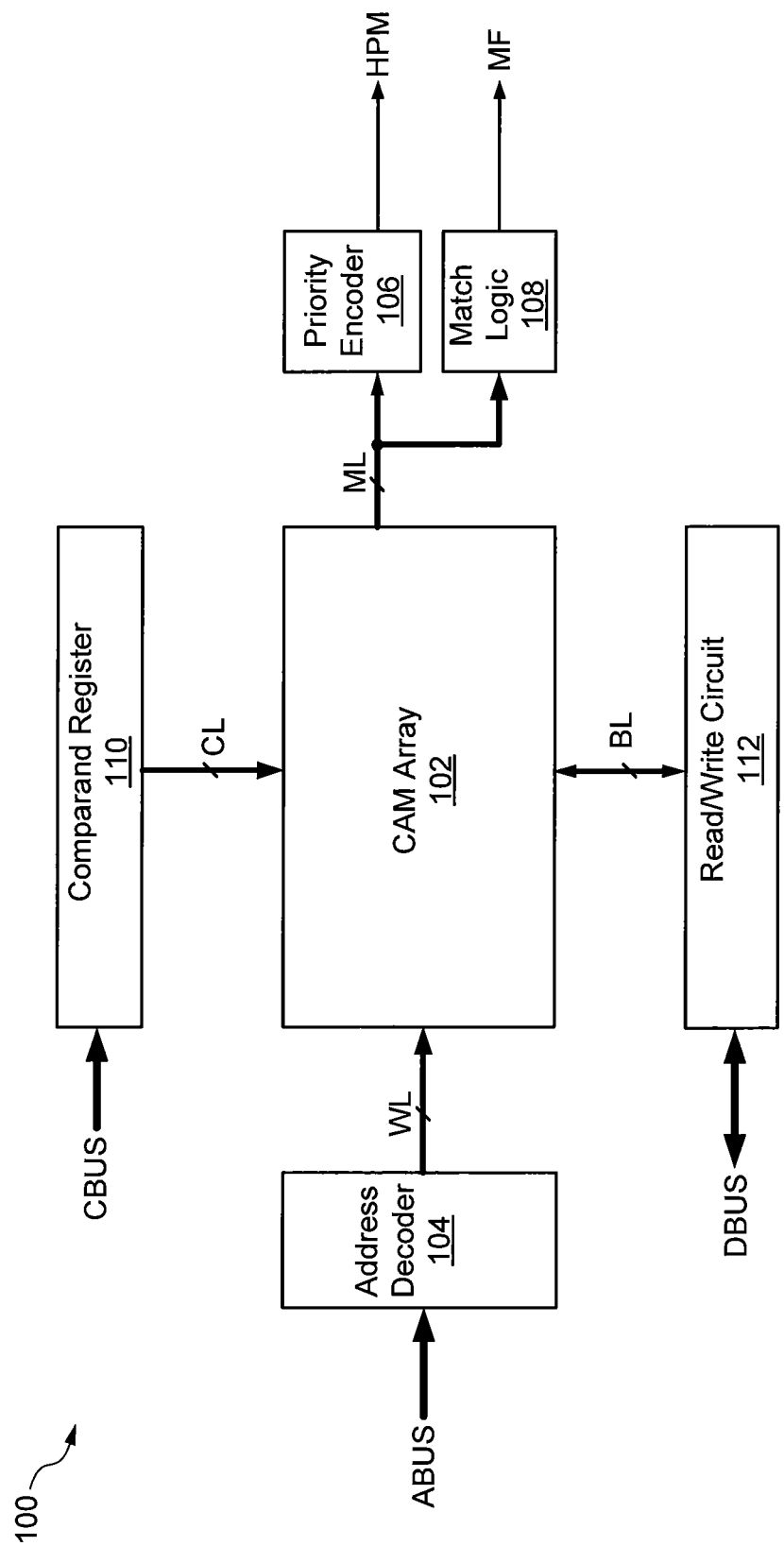
FIG. 1 shows a content addressable memory (CAM) device within which the present embodiments may be implemented.

A method and apparatus for incrementally charging the match lines of a CAM array are disclosed below in the context of a row of CAM cells for simplicity only. It is to be understood that the present embodiments may be used in any suitable CAM array or device including, for example, either NOR or NAND type CAM arrays. In the following description, for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present embodiments unnecessarily. Additionally, the interconnection between circuit elements or blocks may be shown as buses or as single signal lines. Each of the buses may alternatively be a single signal line, and each of the single signal lines may alternatively be a bus. Further, the logic levels assigned to various signals in the description below are arbitrary, and therefore may be modified (e.g., reversed polarity) as desired. Accordingly, the present embodiments are not to be construed as limited to specific examples described herein but rather include within their scope all embodiments defined by the appended claims.

Embodiments for incrementally charging the match lines of a CAM array reduce power consumption during compare operations by partially pre-charging the match lines to an intermediate voltage during a pre-charge phase of the compare operation and then selectively charging the match lines higher towards a supply voltage in response to match conditions in the corresponding rows of the array. Because the intermediate voltage is significantly less than the supply voltage, partially pre-charging the match lines to the intermediate voltage (rather than to the supply voltage) reduces power consumption associated with match line pre-charging. For some embodiments, the intermediate voltage corresponds to the minimum voltage level that can be readily interpreted by a match line detection circuit as a match condition. For one embodiment, the intermediate voltage is approximately one-half the supply voltage.

More specifically, for some embodiments, an incremental match line charge circuit uses a first pre-charge clock pulse to pre-charge the match lines to the intermediate voltage during the pre-charge phase. Then, during the evaluation phase, a search key is provided to the array and compared with data stored in the array to generate match results for the rows of the array. For each row of CAM cells, if the search key matches the data stored therein, the match line remains in its pre-charged state. Conversely, if the search key does not match the data stored therein, one or more CAM cells storing the mismatching data begin discharging the match line to indicate the mismatch condition. Concurrently, the incremental match line charge circuit uses a second pre-charge clock pulse to selectively charge each match line higher towards the supply voltage in response to the match results for the corresponding row. Thus, for some embodiments, if the match line voltage remains at or above the intermediate voltage (e.g., thereby indicating a match condition), then a feedback signal is asserted to cause the incremental match line charge circuit to increase the voltage on the match line so that the resulting match condition can be more readily detected (e.g., by a match latch associated with the row). Conversely, if the match line voltage falls below the intermediate voltage (e.g., thereby indicating a mismatch condition), then the feedback signal is de-asserted to prevent the incremental match line charge circuit from further charging the match line. In this manner, match lines corresponding to rows that store mismatching data are only pre-charged to the intermediate voltage (e.g., rather than being completely pre-charged to the supply voltage), thereby reducing power consumption associated with match line charging operations.

The incremental match line charge circuits can be further configured to pre-charge only those match lines corresponding to CAM rows that contain valid data. For such embodiments, each row of CAM cells stores a valid bit indicating whether the corresponding row stores valid data. If the valid bit for a CAM row is asserted (e.g., to indicate that the CAM row stores valid data), the incremental match line charge circuit pre-charges the row's match line. Conversely, if the valid bit for the CAM row is de-asserted (e.g., to indicate that the CAM row does not store valid data), the incremental match line charge circuit does not pre-charge the row's match line, thereby effectively disabling the CAM row for the compare operation. By pre-charging only the match lines for CAM rows that store valid data, power consumption associated with compare operations in the CAM array is further reduced.

For some embodiments, the incremental match line charge circuits can include a control input to receive a calibration signal indicative of a calibration mode. For such embodiments, when an incremental match line charge circuit is in the calibration mode, the pulse width of the first pre-charge signal is incrementally increased until the partial pre-charge operation results in the match lines being pre-charged to a voltage level that is detectable by a match line detector circuit. For some embodiments, the pulse width of the first pre-charge signal is incrementally increased until the match lines are partially pre-charged to the threshold voltage level of the match line detector circuit. The pulse width of the first pre-charge signal is stored in a suitable memory element, and is thereafter used during a normal operation mode to control the pulse width of the first pre-charge signal.

FIG. 1 shows an exemplary CAM device 100 within which present embodiments can be implemented. CAM device 100 includes a CAM array 102 that has a plurality of CAM cells (not shown in FIG. 1 for simplicity) arranged in any number of rows and columns. The CAM cells in array 102 may be any suitable type of CAM cell including, for example, binary, ternary, and/or quaternary CAM cells. One or more instructions and related control signals may be provided to CAM device 100 from an instruction decoder (not shown for simplicity) to control read, write, compare, and/or test operations for CAM device 100. Other well-known signals that may be provided to CAM device 100, such as enable signals, reset signals, and clock signals, are not shown for simplicity.

Each row of CAM cells in array 102 is coupled to an address decoder 104 via a corresponding word line WL, and to a priority encoder 106 and to match logic 108 via a corresponding match line ML. The word lines and match lines are represented collectively in FIG. 1 for simplicity. For one embodiment, address decoder 104 receives addresses from an address bus ABUS. For other embodiments, address decoder 104 receives addresses from another bus. The match lines ML provide match results for compare operations to priority encoder 106, which determines the matching entry that has the highest priority number associated with it and generates the index or address of this highest priority match (HPM). Match logic 108 can generate a match flag to indicate a match condition, and can also generate a multiple match flag to indicate multiple matches.

Further, although not shown in FIG. 1 for simplicity, each row of CAM cells in array 102 can have one or more validity bits to indicate whether the corresponding row (or segment thereof) of CAM cells is in a valid state or an empty state. The validity bits can be provided to priority encoder 106 to generate the next free address (NFA) that is available in CAM array 102 for storing new data. The validity bits can also be provided to a well-known full flag logic circuit (not shown for simplicity) to generate a full flag and/or empty flag for CAM array 102.

Each column of CAM cells in array 102 is coupled to a comparand register 110 via comparand lines CL and to a read/write circuit 112 via bit lines BL. The comparand lines and bit lines are represented collectively in FIG. 1 for simplicity. Comparand register 110, which is well-known, provides a comparand word (e.g., a search key) received from a comparand bus CBUS to CAM array 102 for comparison with entries stored in CAM array 102. For other embodiments, comparand words can be provided to comparand register 110 from another bus. Read/write circuit 112 includes well-known write drivers and sense amplifiers, and is coupled to a data bus DBUS. During write operations, read/write circuit 112 provides data via the bit lines BL to a row of CAM cells selected by address decoder 104 via the word lines in response to ABUS. During read operations, data read from a row of CAM cells selected by address decoder 104 is provided to read/write circuit 112 via the bit lines BL. Although not shown for simplicity, CAM device 100 can also include a global mask circuit that stores one or more mask patterns that mask entries in CAM array 102 during compare operations with the comparand word provided by comparand register 110.

Figure 2:
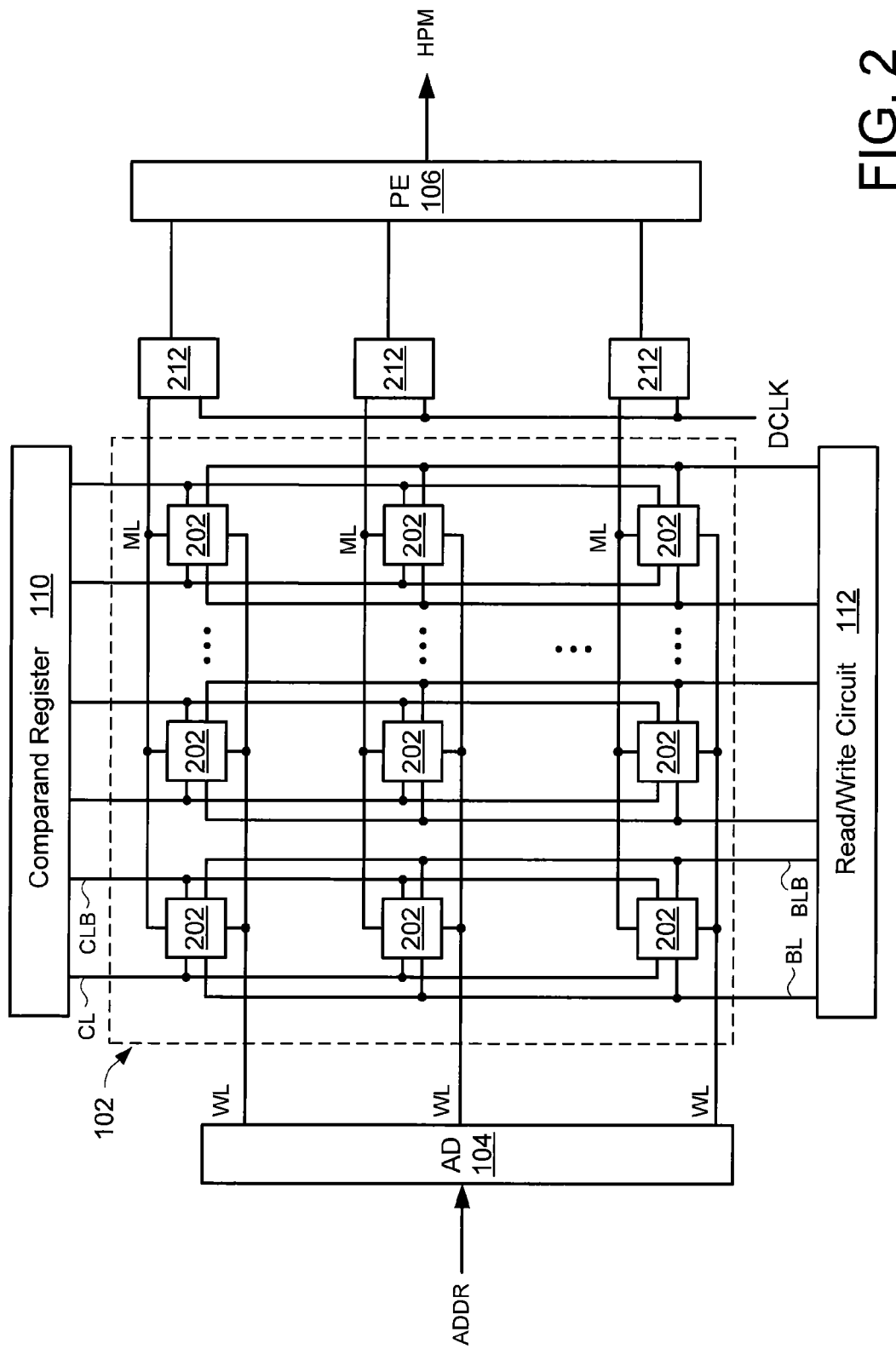
FIG. 2 is a block diagram of one embodiment of the CAM array of FIG. 1.

FIG. 2 is a more detailed block diagram of the CAM array 102 of FIG. 1. CAM array 102 is shown to include a plurality of CAM cells 202 organized in any number of rows and columns. The CAM cells 202 can be any suitable type of CAM cell including, for example, binary CAM cells, ternary CAM cells, and/or quaternary CAM cells. As noted above, each row of CAM array 102 may also include one or more validity bits. Each row of CAM cells 202 is coupled to a match line ML and to a word line WL. Each word line WL is driven by address decoder 104 (see also FIG. 1) to select one or more rows of CAM cells 202 for writing or reading. Each match line ML is coupled to priority encoder 106 via a corresponding match latch 212. The match latches 212 are clocked by a data clock signal DCLK in a well-known manner. Each column of CAM cells 202 in CAM array 102 is coupled to read/write circuit 112 via a complementary bit line pair BL/BLB, and to comparand register 110 via a complementary comparand line pair CL/CLB.

Prior to compare operations, the match lines ML are pre-charged (e.g., to an intermediate voltage level), and each set of complementary comparand line pairs CL/CLB are driven to the same predetermined logic level (e.g., to logic low for quaternary CAM cells). Then, during compare operations, the comparand register 110 provides the search key (i.e., the comparand word) to the CAM cells 202 by driving each pair of complementary comparand lines CL/CLB to opposite logic states indicative of the corresponding bit of the search key. For example, to provide a logic low comparand bit (C) to a column of CAM cells, the corresponding comparand line CL is driven to a first logic state (e.g., logic low) and the corresponding complementary comparand line CLB is driven to a second logic state (e.g., logic high); conversely, to provide a logic high comparand bit C to the column of CAM cells, the corresponding comparand line CL is driven to the second logic state (e.g., logic high) and the corresponding complementary comparand line CLB is driven to the first logic state (e.g., logic low). Thereafter, if all the CAM cells 202 in a particular row match the corresponding bits of the search key, then the match line ML will be charged from the intermediate voltage towards a higher voltage to indicate the match condition. Conversely, if one or more of the CAM cells 202 in the row do not match the corresponding bit of the search key, then mismatching CAM cells 202 discharge the match line (e.g., towards ground potential) to indicate the mismatch condition.

Figure 3:
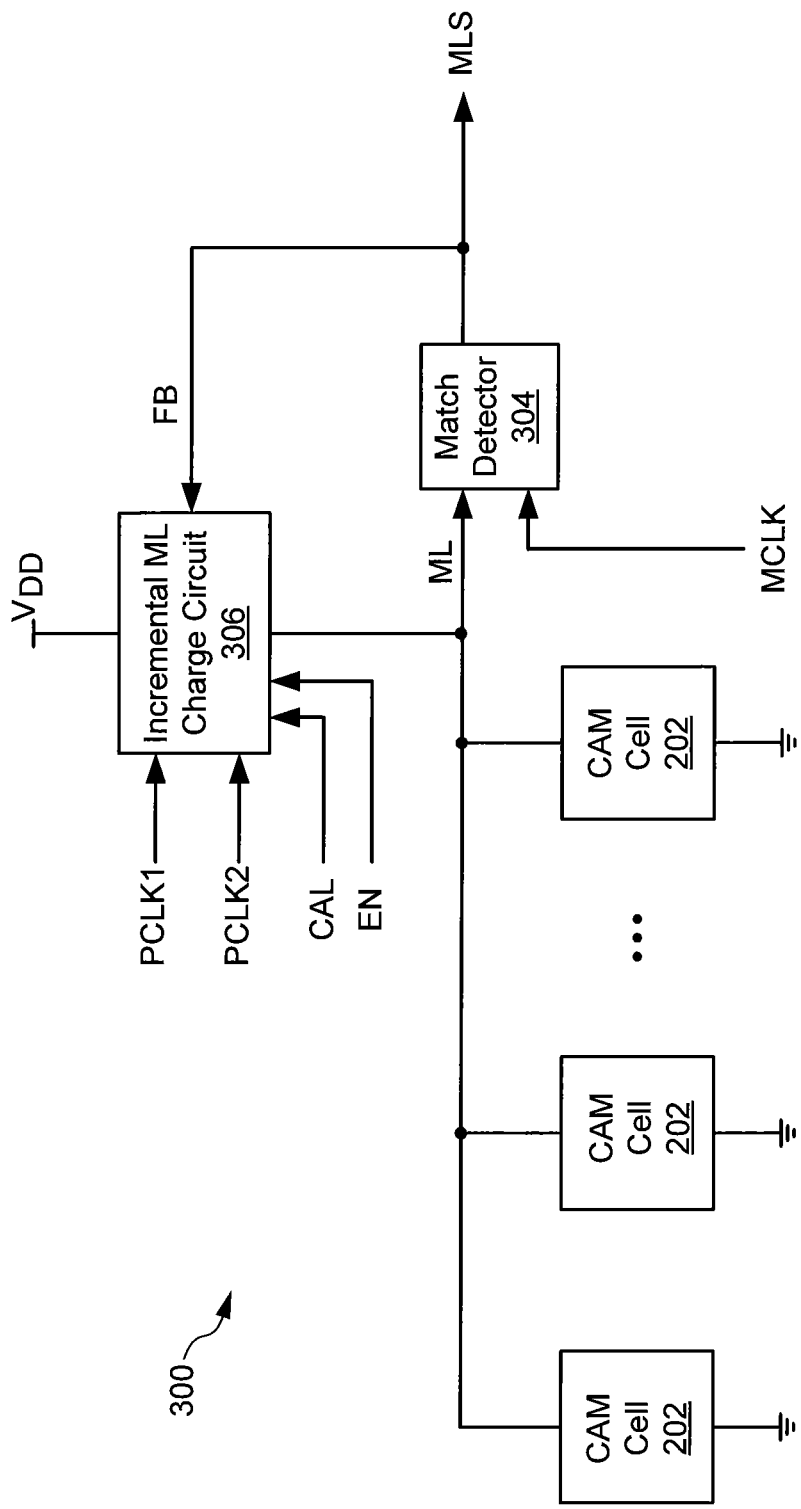
FIG. 3 is a block diagram of a row of the CAM array of FIG. 2 that includes an incremental match line charge circuit in accordance with some embodiments.

FIG. 3 is a block diagram of a row 300 that is one embodiment of a row of CAM cells of CAM array 102 of FIG. 1. Row 300 includes a plurality of CAM cells 202, a match detector circuit 304, and an incremental match line charge circuit 306. Each CAM cell 202, which can be any suitable type of CAM cell including, for example, a binary CAM cell, a ternary CAM cell, or a quaternary CAM cell, is coupled between match line ML and ground potential. Although not shown for simplicity, each CAM cell 202 includes at least one storage element to store one or more data bits and includes at least one compare circuit that compares a bit of the search key with data stored in the storage element. The storage element(s) can be implemented using Static Random Access Memory (SRAM), Dynamic RAM (DRAM), a non-volatile memory cell (e.g., EEPROM or flash memory cell), or any other suitable memory element. For simplicity, word lines, bit lines, comparand lines, and other well-known elements of the associated CAM array are not shown in FIG. 3. In addition, various well-known clock, enable, and control signals are not shown in FIG. 3 for simplicity.

Match detector circuit 304, which can be any suitable voltage detection circuit, sense amplifier, and/or latch, includes a data input coupled to the match line ML, a clock input to receive an optional match clock MCLK, and an output coupled to a sensed match line MLS. Although not shown for simplicity, the other end of the sensed match line MLS can be coupled to the input of a corresponding match latch 212 that stores match results during compare operations and provides the match results to priority encoder 106 (see also FIG. 1) to generate the address of the HPM. Further, although not shown in FIG. 3, match detector circuit 304 includes power terminals coupled to the supply voltage $V_{DD}$ and to ground potential.

In operation, match detector circuit 304 detects the voltage level on the match line ML (hereinafter referred to as the match line voltage $V_{ML}$), and in response thereto drives the sensed match line MLS to either a match state or to a mismatch state. For example, if the voltage $V_{ML}$ is at or above a threshold voltage ($V_T$) of match detector circuit 304 (e.g., indicative of a match condition for the row), then match detector circuit 304 drives the sensed match line MLS to a logic high state (e.g., to $V_{DD}$) to indicate the match condition. Conversely, if the voltage $V_{ML}$ is below the threshold voltage of match detector circuit 304 (e.g., indicative of a mismatch condition for the row), then match detector circuit 304 drives the sensed match line MLS to a logic low state (e.g., to ground potential) to indicate the mismatch condition.

For the exemplary embodiment shown in FIG. 3, the match clock MCLK can be used to selectively enable match detector circuit 304 to sense the match line voltage $V_{ML}$. For example, assertion of MCLK (e.g., to logic high) can enable match detector circuit 304 to sense $V_{ML}$, and de-assertion of MCLK (e.g., to logic low) can disable match detector circuit 304 from sensing $V_{ML}$. For other embodiments, match detector circuit 304 can receive other control and/or enable signals. For another embodiment, MCLK can be eliminated.

The incremental match line charge circuit 306 is coupled between the match line ML and the supply voltage $V_{DD}$, and includes a data input coupled to the sensed match line MLS, a first clock input to receive a first pre-charge clock signal PCLK1, and a second clock input to receive a second pre-charge clock signal PCLK2. The voltage on the sensed match line MLS is provided as a feedback signal (FB) to charge circuit 306, as depicted in FIG. 3. Further, for the exemplary embodiment shown in FIG. 3, charge circuit 306 is also shown to include a first control input to receive an enable signal (EN), and to include a second control input to receive a calibration signal (CAL). The enable signal EN can be used to selectively enable and disable the charge circuit 306. For example, an asserted state (e.g., logic high) of EN can enable charge circuit 306 to selectively and/or incrementally pre-charge the match line ML, and a de-asserted state (e.g., logic low) of EN can disable charge circuit 306 from pre-charging the match line ML. The calibration signal CAL can be used to selectively calibrate the incremental match line charge circuit 306. For exemplary embodiments described herein, an asserted state (e.g., logic high) of CAL causes charge circuit 306 to enter a calibration mode, and a de-asserted state (e.g., logic low) of CAL causes charge circuit 306 to enter a normal mode for which the charge circuit 306 incrementally pre-charges the match line for compare operations. During the calibration mode, the pulse width of PCLK1 can be adjusted to select a desired voltage level to which the charge circuit 306 partially pre-charges the match line ML during the pre-charge phase of compare operations, as described in more detail below.

The pre-charge clock signals PCLK1 and PCLK2 can be generated by any suitable clock circuit, instruction decoder, or another well-known circuit. For exemplary embodiments described herein, the first pre-charge clock signal PCLK1 is used to partially pre-charge the match line ML to an intermediate voltage during a pre-charge phase of the compare operation, and the second pre-charge clock signal PCLK2 is used to further (e.g., completely) charge the match line ML towards $V_{DD}$ during an evaluation phase of the compare operation. More specifically, during the pre-charge phase of the compare operation, the first pre-charge clock signal PCLK1 is asserted (e.g., pulsed to logic high). In response thereto, charge circuit 306 partially pre-charges the match line to an intermediate voltage ($V_{INT}$) that is less than the full match line pre-charge voltage ($V_{FULL}$). The value of $V_{INT}$, which can be predetermined or dynamically selected during the calibration mode, should be equal to or greater than the threshold voltage ($V_T$) of match detector circuit 304 (e.g., so that the pre-charged match line voltage can be interpreted as a match condition by match detector circuit 304). For some embodiments in which the full pre-charge voltage $V_{FULL}$ is approximately equal to $V_{DD}$, the intermediate voltage $V_{INT}$ is approximately equal to $V_{DD}/2$. For other embodiments, the intermediate voltage $V_{INT}$ can be another suitable voltage between ground potential and $V_{DD}$.

During the evaluation phase of the compare operation, comparand data (e.g., the search key) is provided to CAM row 300 for comparison with data stored in CAM cells 202, and the match results for each row 300 are provided on the row's match line ML. Thus, if the search key matches the data stored in row 300, then match line ML remains in its pre-charged state (e.g., at $V_{INT}$). Conversely, if the search key does not match the data stored in row 300, one or more CAM cells 202 that store mismatching data begin discharging match line ML to indicate the mismatch condition. While the comparison results are being generated on match line ML, the second pre-charge clock signal PCLK2 is asserted (e.g., pulsed to logic high). In response thereto, charge circuit 306 selectively charges match line ML higher towards $V_{DD}$ in response to the feedback signal FB, which can indicate whether there is a match condition for row 300.

For example, if the match line voltage $V_{ML}$ remains at or above the intermediate voltage $V_{INT}$ (e.g., thereby indicating a match condition), then the feedback signal FB is asserted and causes charge circuit 306 to charge match line ML higher towards $V_{DD}$ so that the resulting match condition can be more readily detected (e.g., by a match latch 212 associated with the row). Conversely, if the match line voltage $V_{ML}$ falls below the intermediate voltage $V_{INT}$ (e.g., thereby indicating a mismatch condition), then the feedback signal FB is de-asserted and prevents charge circuit 306 from further charging match line ML. In this manner, match lines ML corresponding to rows that store mismatching data are only pre-charged to the intermediate voltage (e.g., rather than being completely pre-charged to the full match line pre-charge voltage or to $V_{DD}$), thereby reducing power consumption associated with match line charging operations.

Thus, in accordance with the present embodiments, the incremental match line charge circuit 306 uses PCLK1 to partially pre-charge the match line ML to an intermediate voltage level $V_{INT}$ during the pre-charge phase of the compare operation, and uses PCLK2 to selectively charge the match line ML in response to the feedback signal FB. As mentioned above, for some embodiments, the intermediate voltage $V_{INT}$ is selected to be equal to or slightly greater than the $V_T$ of match detector circuit 304. In this manner, the match lines ML corresponding to rows 300 that do not match the search key are pre-charged only to $V_{INT}$ to reduce power consumption, while the match lines ML corresponding to rows 300 that match the search key are subsequently charged higher towards $V_{DD}$ to ensure that match latches 212 (see also FIG. 2) can readily detect the match conditions.

Note that because the match lines are partially pre-charged to $V_{INT}$ rather than higher towards $V_{DD}$, the detection of a match or mismatch condition has a reduced noise margin, as compared to detecting a full rail match signal. To increase the noise margin, the $V_T$ of match detector circuit 304 can be set closer to ground potential than $V_{DD}/2$. This increases the noise margin for match conditions, but reduces the noise margin for mismatch conditions and allows the $V_{ML}$ of some mismatching rows to be charged higher towards $V_{DD}$ in response to assertion of PCLK2. This is acceptable because these match lines will eventually be discharged by the mismatching CAM cell(s) in the row, as discussed in more detail below.

Figure 4:
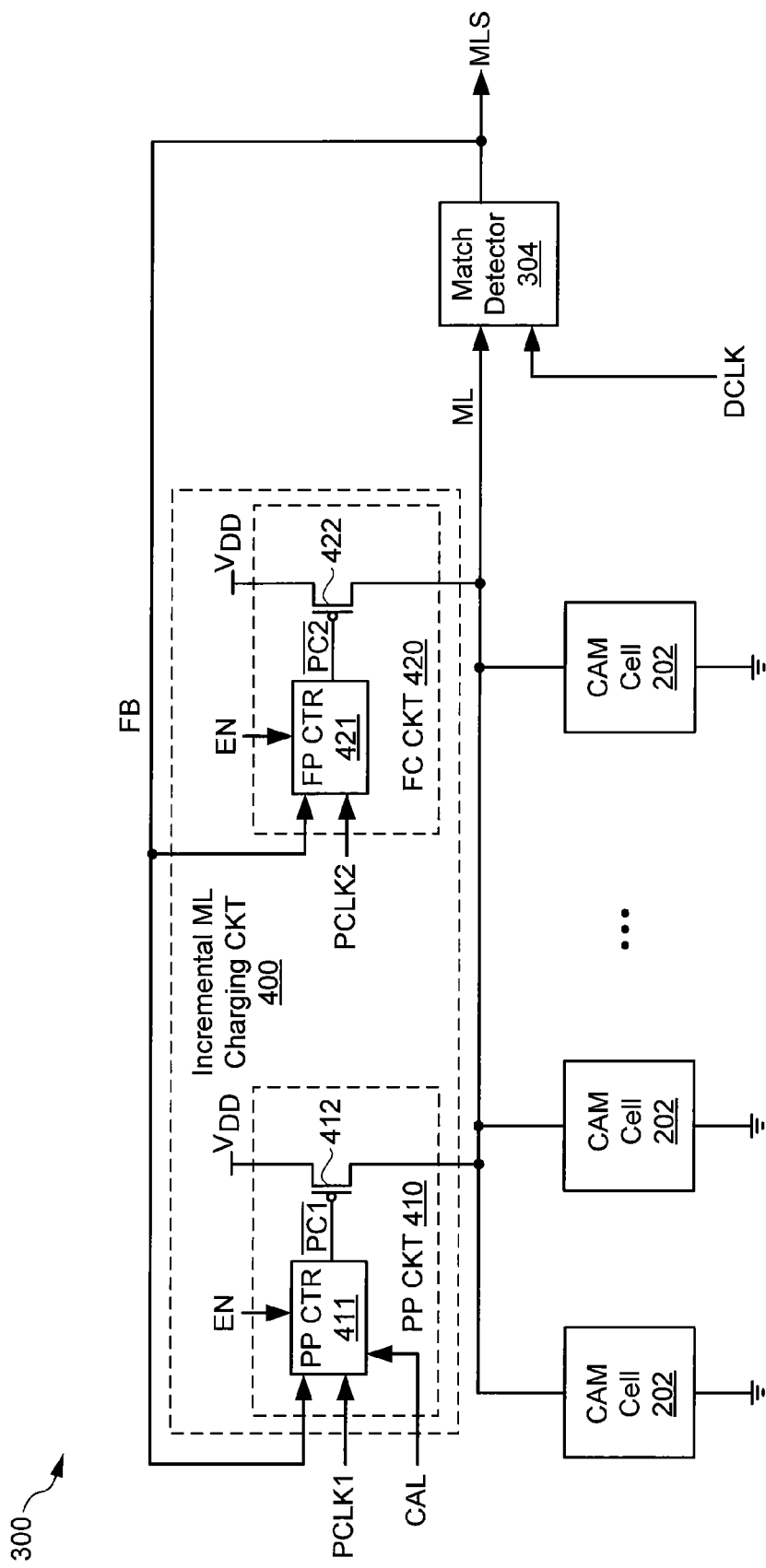
FIG. 4 is a more detailed block diagram of the row of FIG. 3 in accordance with some embodiments.

FIG. 4 is a more detailed block diagram of an incremental match line charge circuit 400 that is one embodiment of the incremental match line charge circuit 306 of FIG. 3. Charge circuit 400 is shown to include a partial pre-charge (PP) circuit 410 and a full charge (FC) circuit 420. The partial pre-charge circuit 410 includes a PMOS pull-up transistor 412 and a partial pre-charge control circuit 411. PMOS pull-up transistor 412 is coupled between $V_{DD}$ and match line ML, and has a gate to receive a first active-low pre-charge control signal $\overline{PC1}$ provided by control circuit 411. Control circuit 411 includes a data input to receive the FB signal, control inputs to receive the enable signal EN and the calibration signal CAL, and a clock input to receive PCLK1. The full charge circuit 420 includes a PMOS pull-up transistor 422 and a full pre-charge control circuit 421. PMOS pull-up transistor 422 is coupled between $V_{DD}$ and match line ML, and has a gate to receive a second active-low pre-charge control signal $\overline{PC2}$ provided by control circuit 421. Control circuit 421 includes a data input to receive the FB signal, a control input to receive the EN signal, and a clock input to receive PCLK2.

For normal operations of CAM device 100 (see also FIG. 1), the EN signal is asserted (e.g., to logic high) and the CAL signal is de-asserted (e.g., to logic low). Then, during the pre-charge phase of a compare operation, control circuit 411 logically combines the FB signal and PCLK1 to partially pre-charge the match line ML to $V_{INT}$, which for purposes of discussion hereinafter is selected to be the $V_T$ of match detector circuit 304. More specifically, when PCLK1 is pulsed to logic high, control circuit 411 asserts $\overline{PC1}$ to a logic low state (e.g., to ground potential) to turn on PMOS pull-up transistor 412, which in turn pre-charges the match line to $V_{INT}$. Control circuit 411 maintains $\overline{PC1}$ in its asserted state until either (1) the asserted pulse of PCLK1 ends or (2) the FB signal is asserted (e.g., to logic high) by match detector circuit 304. As discussed above, the pulse width of PCKL1 is selected (e.g., during calibration mode) such that the match line ML is partially pre-charged to $V_{INT}$ by partial pre-charge circuit 410. However, if the match line ML is pre-charged to a voltage that exceeds $V_{INT}$ $V_T$, then match detector circuit 304 asserts the FB signal to logic high. In response thereto, control circuit 411 de-asserts $\overline{PC1}$ (e.g., to logic high), which turns off PMOS pull-up transistor 412 to stop pre-charging the match line ML. In this manner, assertion of the FB signal effectively clamps the partial pre-charge voltage to approximately $V_T$.

During the evaluation phase of the compare operation, comparand data (e.g., the search key) is provided to CAM row 300 for comparison with data stored in CAM cells 202, and the match results for each row 300 are provided on the row's match line ML. The control circuit 421 of full charge circuit 420 logically combines the FB signal and PCLK2 to selectively charge the match line ML higher towards $V_{DD}$. More specifically, when PCLK2 is pulsed to logic high, control circuit 421 selectively asserts $\overline{PC2}$ (e.g., to logic low) in response to match conditions detected on the match line ML. Thus, if the match line voltage is greater than (or equal to) $V_T$, which can indicate a match condition for row 300, then match detector circuit 304 asserts the FB signal, which in turn causes control circuit 421 to assert $\overline{PC2}$. In response thereto, PMOS pull-up transistor 422 turns on and completely charges the match line towards $V_{DD}$. Conversely, if the match line voltage is less than $V_T$, which can indicate a mismatch condition for row 300, then match detector circuit 304 de-asserts the FB signal, which in turn causes control circuit 421 to de-assert $\overline{PC2}$ (e.g., to logic high). In response thereto, PMOS pull-up transistor 422 is maintained in a non-conductive state and does not further charge the match line ML.

Figure 5A:
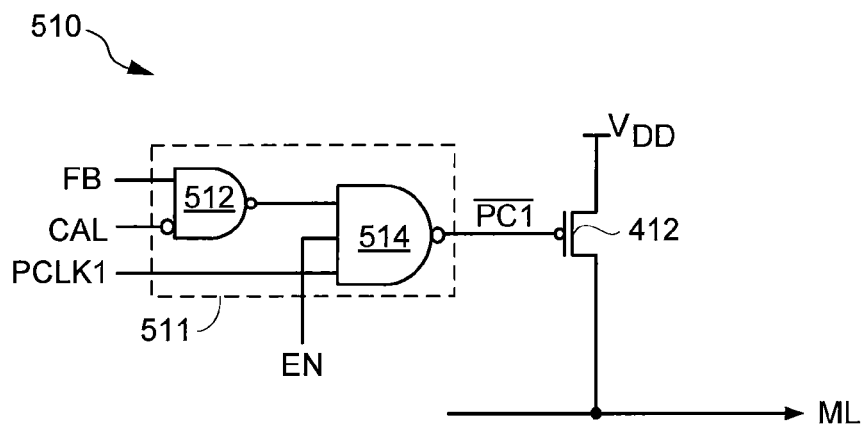
FIG. 5A is a circuit diagram of one embodiment of the partial pre-charge circuit of FIG. 4.

FIG. 5A shows a partial pre-charge circuit 510 that is one embodiment of partial pre-charge circuit 410 of FIG. 4. Pre-charge circuit 510 is shown to include PMOS pull-up transistor 412 and a control circuit 511 that is one embodiment of control circuit 411 of FIG. 4. Control circuit 511 includes NAND gates 512 and 514. NAND gate 512 includes a non-inverted input to receive the FB signal, an inverted input to receive the CAL signal, and an output coupled to a first input of NAND gate 514. NAND gate 514 includes other inputs to receive the EN signal and PCLK1, and includes an output to provide $\overline{PC1}$ to the gate of PMOS pull-up transistor 412. During the normal mode, the EN signal is asserted (e.g., to logic high) and the CAL signal is de-asserted (e.g., to logic low). The logic low state of CAL, provided to the inverted input of NAND gate 512, causes NAND gate 512 to pass a logically inverted value of the FB signal to the first input of NAND gate 514. The logic high state of EN allows NAND gate 514 to generate $\overline{PC1}$ in response to a logical NAND combination of the complemented FB signal and PCLK1.

For example, when FB is de-asserted to logic low at the beginning of the compare operation, NAND gate 512 drives the first input of NAND gate 514 to logic high. In response thereto, NAND gate 514 inverts the logic state of PCLK1 to generate $\overline{PC1}$. Thus, when PCLK1 is de-asserted to logic low, NAND gate 514 drives $\overline{PC1}$ to logic high, which maintains PMOS pull-up transistor 412 in a non-conductive state. Conversely, when PCLK1 is pulsed to logic high, NAND gate 514 pulses $\overline{PC1}$ to logic low to turn on PMOS pull-up transistor 412, which partially pre-charges the match line ML to $V_{INT}$. If the match line voltage $W_{ML}$ exceeds the $V_T$ of match detector circuit 304, then match detector circuit 304 asserts the FB signal to logic high, which forces the output of NAND gate 512 to logic low. In response thereto, NAND gate 514 drives $\overline{PC1}$ to logic high, thereby turning off PMOS pull-up transistor 412 to stop charging the match line ML. In this manner, assertion of the FB signal effectively clamps the partial pre-charge voltage to approximately $V_T$.

Figure 5B:
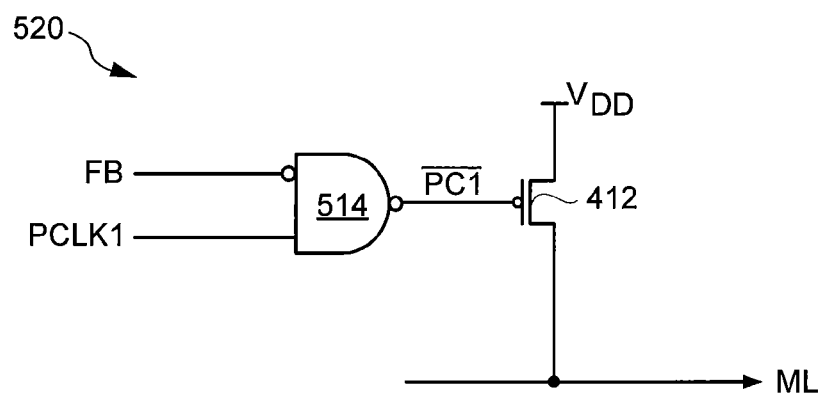
FIG. 5B is a circuit diagram of another embodiment of the partial pre-charge circuit of FIG. 4.

FIG. 5B shows a simplified partial pre-charge circuit 520 that is another embodiment of partial pre-charge circuit 410 of FIG. 4. Pre-charge circuit 520 is similar to partial pre-charge circuit 510 of FIG. 5A, except that the EN and CAL signals are omitted. Thus, for embodiments and/or rows 300 in which the EN and CAL signals are not used, partial pre-charge circuit 520 can be used as partial pre-charge circuit 410 of FIG. 4. As shown in FIG. 5B, partial pre-charge circuit 520 includes PMOS pull-up transistor 412 and NAND gate 514, where NAND gate 514 includes an inverted input to receive the FB signal, a non-inverted input to receive PCLK1, and an output to provide $\overline{PC1}$ to the gate of PMOS pull-up transistor 412.

Figure 5C:
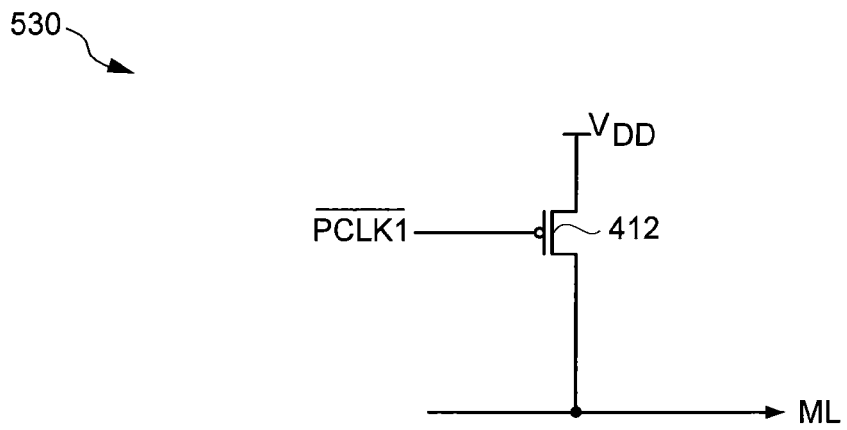
FIG. 5C is a circuit diagram of yet another embodiment of the partial pre-charge circuit of FIG. 4.

FIG. 5C shows a simplified partial pre-charge circuit 530 that is yet another embodiment of partial pre-charge circuit 410 of FIG. 4. Pre-charge circuit 530 is similar to partial pre-charge circuit 520 of FIG. 5B, except that the FB signal is omitted. Thus, for embodiments and/or rows 300 in which the EN, CAL and FB signals are not used for partially pre-charging the match line, partial pre-charge circuit 530 can be used as partial pre-charge circuit 410 of FIG. 4. As shown in FIG. 5C, partial pre-charge circuit 520 includes PMOS pull-up transistor 412 having a gate to receive a logically inverted clock signal PCLK1.

Figure 6A:
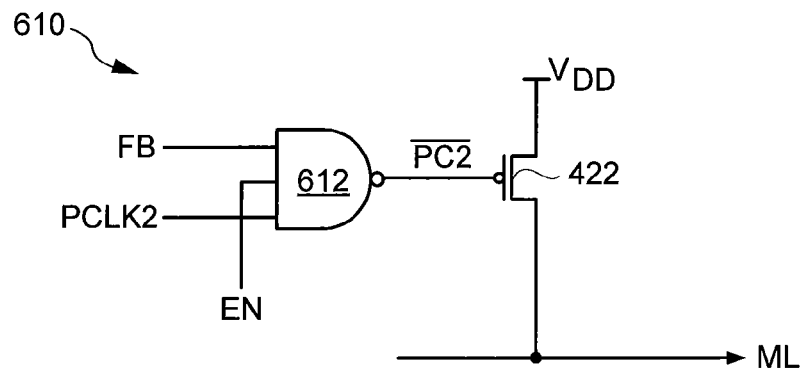
FIG. 6A is a circuit diagram of one embodiment of the full charge circuit of FIG. 4.

FIG. 6A shows a full charge circuit 610 that is one embodiment of full charge circuit 420 of FIG. 4. Charge circuit 610 is shown to include PMOS pull-up transistor 422 and a NAND gate 612. NAND gate 612 includes non-inverted inputs to receive the FB signal, the EN signal, and PCLK2, and includes an output to provide the control signal $\overline{PC2}$ to the gate of PMOS pull-up transistor 422. During the normal mode, the EN signal is asserted (e.g., to logic high), which allows NAND gate 612 to generate $\overline{PC2}$ in response to a logical NAND combination of the FB signal and PCLK2.

For example, during the evaluation phase of the compare operation (e.g., after the match line ML has been partially pre-charged to $V_T$), the search key is compared with data stored in the CAM cells 202 of row 300 to generate match results on the match line ML. If there is a match condition, the match line voltage $V_{ML}$ remains at approximately $V_T$, which causes match detector circuit 304 to assert the FB signal. Thus, when PCLK2 is asserted during the evaluation phase with the FB signal concurrently asserted, NAND gate 612 drives $\overline{PC2}$ to logic low. In response thereto, PMOS pull-up transistor 422 turns on and charges the match line ML higher towards $V_{DD}$. Conversely, if one or more CAM cells 202 in row 300 do not match the search key, then those mismatching CAM cells 202 begin discharging the match line ML low towards ground potential. Thus, if the match line voltage $V_{ML}$ falls below $V_T$, which indicates that there is a mismatch condition, then match detector circuit 304 de-asserts the FB signal. The resulting logic low state of the FB signal forces NAND gate 612 to drive $\overline{PC2}$ to logic high, even if/when PCLK2 is asserted. In response to the logic high state of $\overline{PC2}$, PMOS pull-up transistor 422 is maintained in a non-conductive state and therefore does not further charge the match line ML.

Figure 6B:
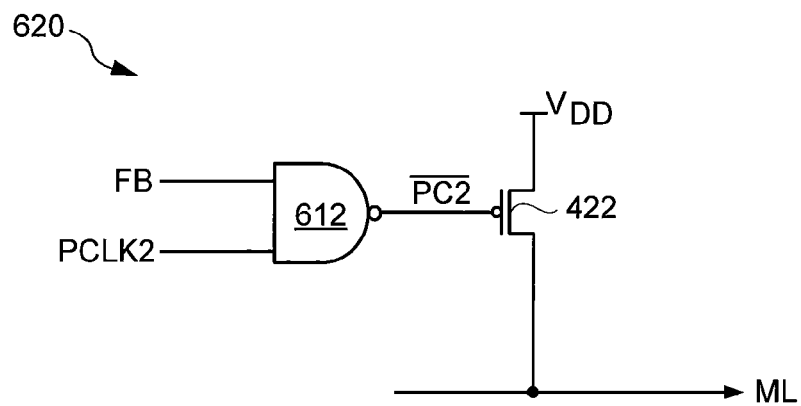
FIG. 6B is a circuit diagram of another embodiment of the full charge circuit of FIG. 4.

FIG. 6B shows a simplified full charge circuit 620 that is another embodiment of full charge circuit 420 of FIG. 4. Charge circuit 620 is similar to charge circuit 610 of FIG. 6A, except that the EN signal is omitted. Thus, for embodiments and/or rows 300 in which the EN signal is not used, full charge circuit 620 can be used as full charge circuit 420 of FIG. 4. As shown in FIG. 6B, full charge circuit 620 includes PMOS pull-up transistor 412 and NAND gate 612, where NAND gate 612 includes inputs to receive PCLK2 and the FB signal, and includes an output to provide $\overline{PC2}$ to the gate of PMOS pull-up transistor 422. Operation of full charge circuit 620 is similar to that of full charge circuit 610 of FIG. 6A when the EN signal is asserted to logic high.

Referring again to FIG. 4, the incremental match line charge circuit 400 is shown to include a partial pre-charge circuit 410 and a full charge circuit 420, which are both dynamic charge circuits in the sense that they selectively charge the match line ML in response to clock signals PCLK1 and PCLK2, respectively. Although not shown for simplicity, row 300 can also include a static pre-charge circuit that continuously charges the match line ML towards VDD.

Figure 7:
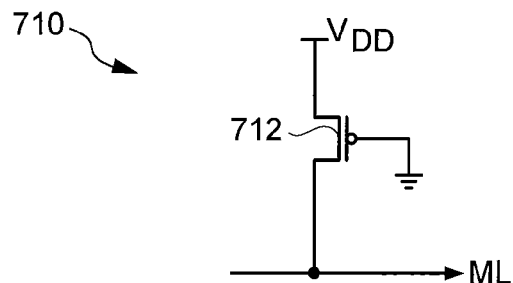
FIG. 7 is a circuit diagram of one embodiment of a static pre-charge circuit that can be implemented within the charge circuit of FIG. 4.

For example, FIG. 7 shows a static pre-charge circuit 710 that can be used to continuously provide a charging current for the match line ML of row 300. More specifically, static pre-charge circuit 710 is shown in FIG. 7 as including a PMOS pull-up transistor 712 coupled between the match line ML and $V_{DD}$, and having a gate coupled to ground potential. In this manner, transistor 712 is maintained in a conductive state to continuously charge match line ML toward $V_{DD}$ during both the pre-charge and evaluation phases of compare operations, thereby ensuring that logic high levels on the match line ML indicating a match condition are maintained throughout the evaluation phase. Because static pre-charge circuit 710 is maintained in a conductive state, static pre-charge circuit 710 may be referred to as a direct current (DC) pre-charge circuit.

For some embodiments, charge circuit 400 has a much larger current-carrying capacity than does static pre-charge circuit 710. By sourcing more of the match line charge current through charge circuit 400, present embodiments allow the size and current-carrying capacity of static pre-charge circuit 710 to be minimized. Minimizing the current-carrying capacity of static pre-charge circuit 710 further minimizes current flow from $V_{DD}$ to ground potential during the evaluation phase of the compare operation for rows having a mismatch condition (e.g., when one or more CAM cells 202 of row 300 discharge match line ML to ground potential), thereby advantageously reducing power consumption for row 300. Moreover, the constant current flow through static pre-charge circuit 710 can be suitably adjusted so as to maintain match line ML in an acceptable logic high state for rows having a match condition during the evaluation phase of the compare operation, thereby improving data reliability of the CAM row.

An exemplary operation of the incremental match line charge circuit 400 for a compare operation between a comparand word and data stored in CAM cells 202 of row 300 is described below with respect to the exemplary timing diagram of FIG. 8, as well as with respect to FIGS. 1-4, 5B, and 6B. For the example described below, the EN signal is asserted and the CAL signal is de-asserted, and therefore these signals are omitted from the timing diagram of FIG. 8. Initially, the comparand lines CL/CLB are pre-charged to logic high, pre-charge clock signals PCLK1 and PCLK2 are de-asserted, the data clock DCLK is de-asserted, the match line ML is presumed to be in a discharged state, and the FB signal is de-asserted.

Figure 8:
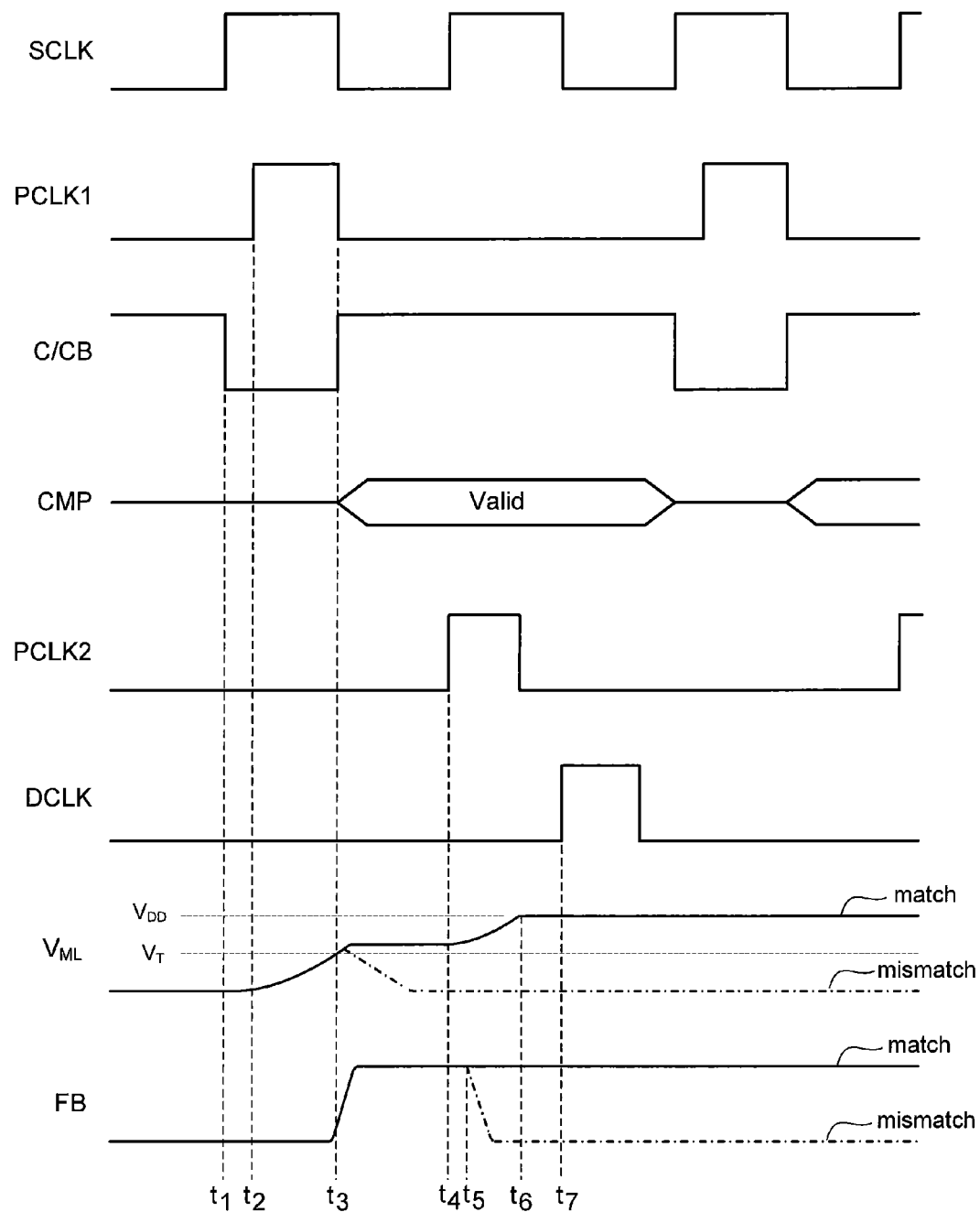
FIG. 8 is a timing diagram illustrating an exemplary operation of one embodiment of the incremental match line charge circuit of FIG. 3.

The pre-charge phase of the compare operation begins at time t1 with a rising edge of a system clock SCLK that triggers comparand register 110 to drive logic low data signals onto the comparand line pairs CL/CLB (see also FIG. 2), as depicted in FIG. 8 by the C/CB signals being driven to logic low. This ensures that the compare circuits (not shown for simplicity) of quaternary CAM cells provided within the CAM array are not conductive during match line pre-charging operations. Shortly thereafter, the first pre-charge clock signal PCLK1 transitions from logic low to logic high, at time t2. The assertion of PCLK1 to logic high, along with the de-asserted state of the FB signal, causes partial pre-charge circuit 520 to partially pre-charge the match line ML to $V_{INT}$ $V_T$. At time t3, PCLK1 is de-asserted to logic low, which causes pre-charge circuit 520 to stop pre-charging the match line ML. Because the match line voltage $V_{ML}$ is now approximately equal to (e.g., and in some embodiments slightly greater than) $V_T$, match detector circuit 304 asserts the FB signal (e.g., indicating that the match line is in a logic high state). As mentioned above, assertion of the FB signal to logic high also forces the partial pre-charge circuit 520 to stop pre-charging the match line ML, thereby clamping the partial pre-charge voltage at approximately $V_T$. Also at time t3, comparand data is driven into the CAM array (e.g., by driving each pair of comparand lines CL/CLB to opposite logic states indicative of corresponding bits of the comparand data), as depicted in FIG. 8 by the C/CB signals being driven to logic high, which corresponds to the end of the pre-charge phase and the beginning of the evaluation phase.

During the evaluation phase, the comparand data provided on comparand lines CL/CLB is compared with data stored in rows 300 of CAM array 102, as indicated by the "valid" waveform for CMP. Thus, shortly after time t3, CAM cells 202 become responsive to bit comparisons between the comparand word and data stored in CAM cells 202. If any of the bit comparisons between the comparand word and the data word stored in row 300 mismatch, the corresponding CAM cell(s) 202 begin discharging the match line ML to ground potential to indicate the mismatch condition shortly after time t3. Conversely, if all of the bit comparisons result in matches, CAM cells 202 do not discharge the match line ML, which in turn remains in its pre-charged state to indicate the match condition.

At time t4, the second pre-charge clock signal PCLK2 is asserted to logic high. The assertion of PCLK2 to logic high allows the full charge circuit 620 to selectively charge the match line higher towards $V_{DD}$ in response to match conditions determined so far, for example, as indicated by the logic state of the FB signal. Thus, if all the CAM cells 202 in a row 300 match the comparand data, then those CAM cells 202 do not begin discharging the match line ML, which remains in its partially pre-charged state at approximately $V_T$ at time t4. In response thereto, match detector circuit 304 maintains the FB signal in its asserted state, which in turn causes full charge circuit 620 to charge the match line higher towards $V_{DD}$ between time t4 and t6.

Conversely, if one or more of the CAM cells 202 in row 300 do not match the comparand word, then those CAM cell(s) 202 begin discharging the match line ML toward ground potential at time t3 to indicate the mismatch condition, as indicated by the dotted $V_{ML}$ waveform in FIG. 8. As $V_{ML}$ falls below $V_T$, match detector circuit 304 de-asserts the FB signal to logic low (as indicated by the dotted FB waveform in FIG. 8) at time t5 to indicate a mismatch condition. In response thereto, full charge circuit 620 does not charge the match line higher towards $V_{DD}$, thereby reducing power consumption by not further charging match lines associated with rows 300 that do not contain matching data.

At time t7, the DCLK is asserted to logic high, which causes match latches 212 of FIG. 2 to latch the logic state of the match lines, and thereafter provide the match results to priority encoder 106 and match logic 108.

Note that for the above embodiments, a multiple-bit mismatch condition (e.g., in which multiple CAM cells 202 within a respective row 300 contain data that does not match the comparand word) will discharge the match line ML faster than a single-bit match condition (e.g., in which only one CAM cell 202 within respective row 300 contains data that does not match the comparand word). Thus, a multiple-bit mismatch condition will fully discharge the match line ML (e.g., to near ground potential) before the second pre-charge clock signal PCLK2 is asserted at time t4. However, because a single-bit mismatch condition discharges the match line ML more slowly, it is possible that the single-bit mismatch condition does not discharge the match line ML below $V_T$ prior to assertion of PCLK2. In this case, although the match line ML of the mismatching row 300 will be charged higher by the full charge circuit 620 in response to the asserted FB signal and PCLK2, the mismatching CAM cell 202 will ultimately pull the match line ML low towards ground potential. This may undesirably result in a brief DC path from $V_{DD}$ to ground potential, but only for single-bit mismatch rows. This situation can be remedied by delaying assertion of PCLK2 until the single-bit mismatch row 300 can discharge the match line below $V_T$.

Further, note that the current-carrying capacities of the PMOS transistors 412 and 422 (described above with respect to FIGS. 5A-5C and 6A-6B, respectively) can be adjusted depending upon desired operating characteristics, as well as upon the size, type, and specific configuration of the CAM cells 202 and their associated array architecture. The PMOS transistor characteristics should be sufficient to provide relatively quick charging of match lines during the pre-charge phase while minimizing power consumption during compare operations. Thus, it is to be understood that the waveforms illustrated for the match line voltage $V_{ML}$ in FIG. 8 are exemplary; for some embodiments, the charge rate (e.g., slope) of the match line voltage $V_{ML}$ may be greater than shown in FIG. 8, while for other embodiments the charge rate of the match line voltage $V_{ML}$ may be less than shown in FIG. 8. Similarly, the discharge rate of the match line voltage $V_{ML}$ may be greater or less than illustrated in FIG. 8.

Figure 9:
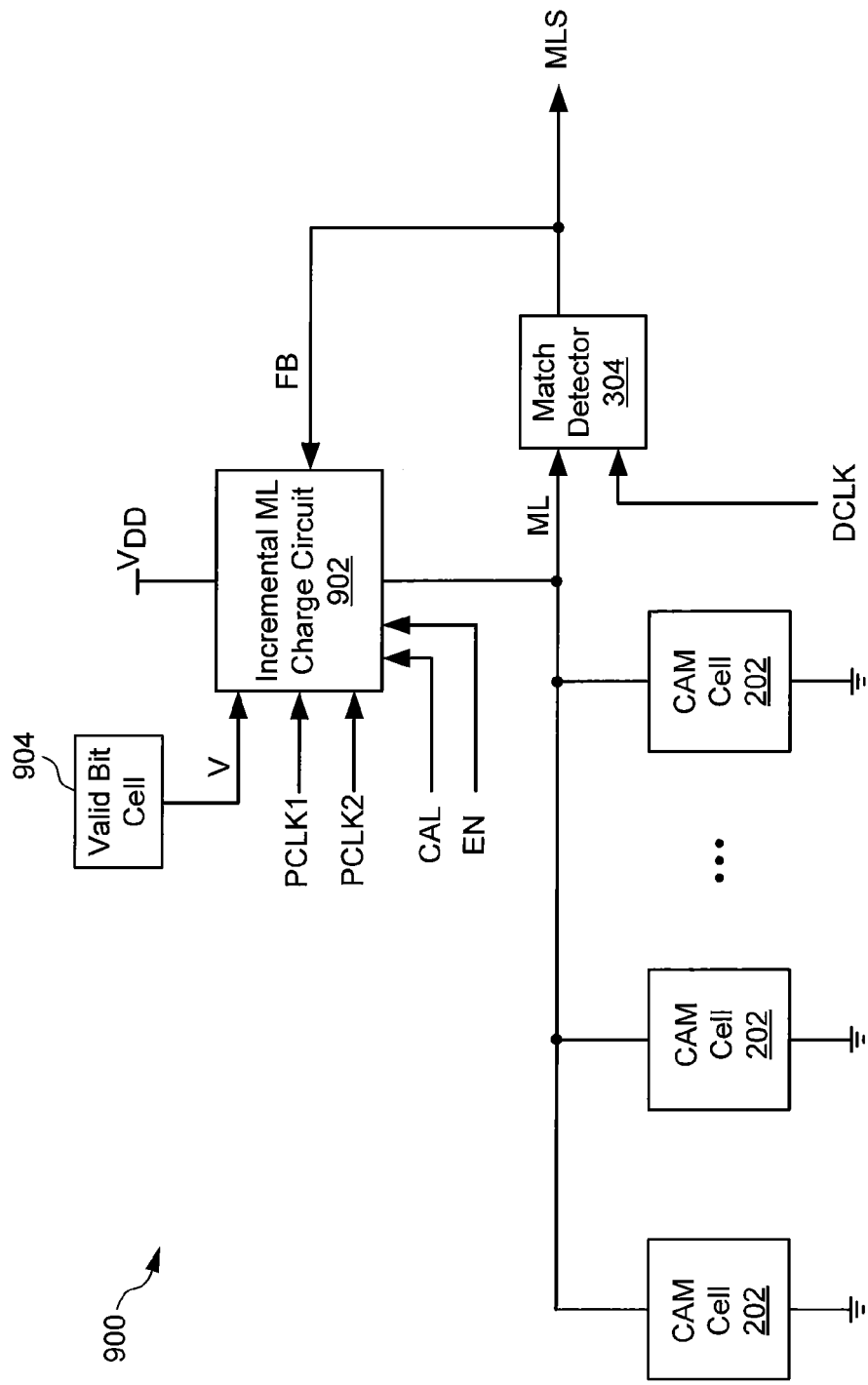
FIG. 9 is a block diagram of a row of the CAM array of FIG. 2 having an incremental match line charge circuit in accordance with other embodiments.

FIG. 9 is a block diagram of CAM row 900 in accordance with another embodiment. Row 900 includes a plurality of CAM cells 202, match line detector circuit 304, an incremental match line charge circuit 902, and a valid bit cell 904. Valid bit cell 904 stores a valid bit (V) that indicates whether the CAM cells 202 of row 900 store valid data. For one embodiment, the V bit is asserted to logic high to indicate that row 900 contains valid data, and the V bit is de-asserted to logic low to indicate that row 900 does not contain valid data. Valid bit cell 904 may be any suitable memory element. For some embodiments, valid bit cell 904 is a memory cell such as, for example, a DRAM, SRAM, Electrically Programmable Read Only Memory (EPROM), or Electrically Erasable Programmable Read Only Memory (EEPROM) cell. For other embodiments, valid bit cell 904 is a well-known CAM cell, and may be coupled between match line ML and ground potential. For one embodiment, valid bit cell 904 is identical to CAM cells 202. For other embodiments, valid bit cell 904 can be a latch or register. Further, although shown in FIG. 9 as including only one valid bit cell 904, row 900 may include additional valid bit cells to store multiple valid bits for row 900.

The charge circuit 902 is coupled between $V_{DD}$ and the match line ML, and includes inputs to receive the EN, CAL, and FB signals, the pre-charge clock signals PCLK1 and PCLK2, and the valid bit V. In accordance with present embodiments, the charge circuit 902 selectively pre-charges the match line ML depending on whether a valid CAM word is stored in the CAM row 900, as indicated by the logic state of the V bit. More specifically, charge circuit 902 operates in a manner similar to that of charge circuit 306 of FIGS. 3-4, except that the V bit provides a gating function for pre-charging operations. For example, during the pre-charge phase of a compare operation, the charge circuit 902 partially pre-charges the match line ML only if the V bit is asserted, and during the evaluation phase of the compare operation, the charge circuit 902 selectively charges the match line ML higher only if the V bit is asserted. In this manner, the charge circuit 902 selectively pre-charges the match line ML only if a valid CAM word is stored in row 900.

As discussed above, power consumption is reduced by only partially pre-charging the match lines to $V_{INT} \ll V_{DD}$, and then further charging only those match lines corresponding to CAM rows that store matching data. Moreover, for the exemplary embodiment of FIG. 9, additional power savings are realized by selectively charging only those CAM rows containing valid CAM words. Such power savings are proportional to the percentage of CAM rows that contain invalid data.

Figure 10A:
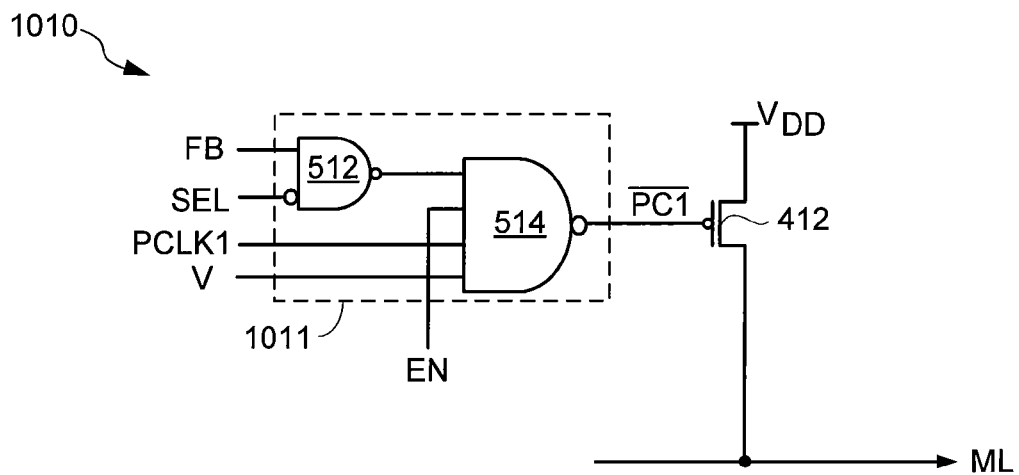
FIG. 10A is a circuit diagram of one embodiment of a partial pre-charge circuit that can be implemented within the incremental match line charge circuit of FIG. 9.

FIG. 10A is a circuit diagram of a partial pre-charge circuit 1010 that can be used within the charge circuit 902 of FIG. 9. Partial pre-charge circuit 1010 is similar to partial pre-charge circuit 510 of FIG. 5A, except that NAND gate 514 is modified to include an additional input to receive the V bit. In this manner, partial pre-charge circuit 1010 drives $\overline{PC1}$ to logic low (to turn on PMOS pull-up transistor 412 and thereby partially pre-charge the match line ML) only if the V bit is asserted to logic high.

Figure 10B:
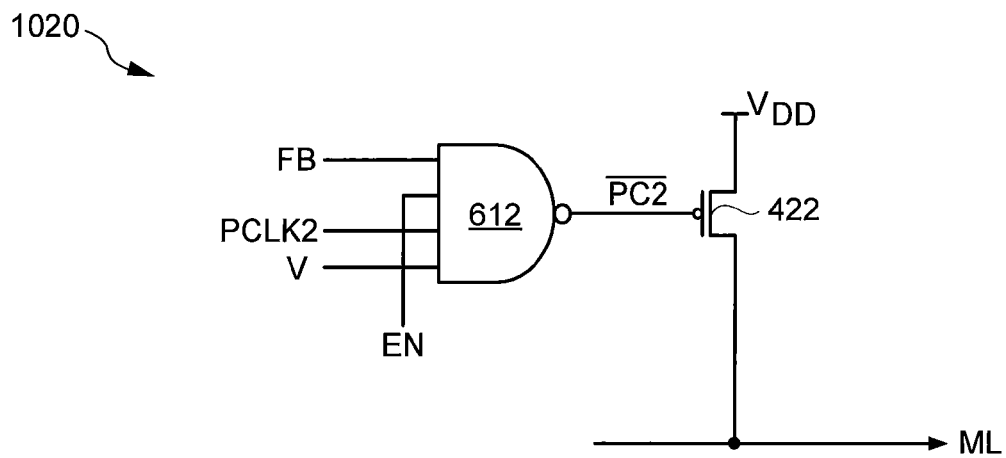
FIG. 10B is a circuit diagram of one embodiment of a full charge circuit that can be implemented within the incremental match line charge circuit of FIG. 9.

FIG. 10B is a circuit diagram of a full charge circuit 1020 that can be used within the charge circuit 902 of FIG. 9. Full charge circuit 1020 is similar to full charge circuit 610 of FIG. 6A, except that NAND gate 612 is modified to include an additional input to receive the V bit. In this manner, full charge circuit 1020 drives $\overline{PC2}$ to logic low (to turn on PMOS pull-up transistor 422 and thereby further charge the match line ML) only if the V bit is asserted to logic high.

Figure 10C:
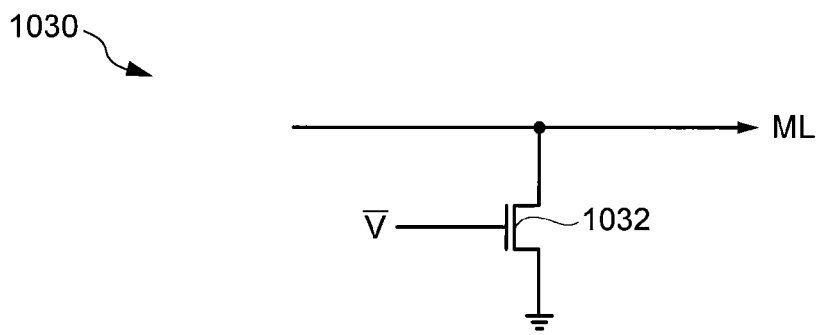
FIG. 10C is a circuit diagram of a match line discharge circuit that can be implemented within the incremental match line charge circuit of FIG. 9.

As an additional and/or alternative embodiment, the charge circuit 902 can also include a discharge circuit that discharges the match line ML to a mismatch state if the valid bit indicates that the corresponding row of CAM cells stores invalid data. For example, FIG. 10C shows a discharge circuit 1030 that includes an NMOS pull-down transistor 1032 coupled between the match line ML and ground potential and having a gate to receive a complemented V bit, which is shown in FIG. 10C as $\overline{V}$. Thus, when V=0 (and $\overline{V}$=1) to indicate that CAM row 900 does not store valid data, NMOS transistor 1032 turns on and discharges the match line ML towards ground potential, thereby disabling the CAM row for compare operations. If, however, $\overline{V}$=0 ($V$=1) to indicate that CAM row 900 stores valid data, transistor 1032 does not discharge the match line ML.

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure. For example, although described above in the context of NOR type CAM arrays, embodiments may be used control the match lines for NAND type CAM arrays.

Further, it should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-

What is claimed is:

1. A content addressable memory (CAM) device including an array having a plurality of rows, wherein a respective row from among the plurality of rows comprises:
   a plurality of CAM cells coupled to a match line;
   a match detector circuit, coupled to the match line, configured to generate a feedback signal indicative of a match line voltage; and
   an incremental charge circuit configured to charge the match line from a first voltage towards a second voltage that is greater than the first voltage during an evaluation phase of a compare operation when the feedback signal indicates a match condition between a search key and data stored in the respective row.

2. The CAM device of claim 1, wherein the incremental charge circuit is further configured to charge the match line towards the second voltage during the evaluation phase only when the feedback signal indicates the match condition.

3. The CAM device of claim 1, wherein the incremental charge circuit is further configured not to charge the match line towards the second voltage when there is a mismatch condition between the search key and the data stored in the respective row.

4. The CAM device of claim 1, wherein the match detector circuit is further configured to de-assert the feedback signal when the match line voltage is less than a threshold voltage of the match detector circuit, and
   wherein the match detector circuit is further configured to assert the feedback signal when the match line voltage exceeds the threshold voltage.

5. The CAM device of claim 1, wherein the incremental charge circuit comprises:
   an input configured to receive a valid bit indicating whether the respective row contains valid data.

6. The CAM device of claim 5, wherein the incremental charge circuit is further configured to charge the match line only when the valid bit is asserted to indicate that the valid data is stored in the respective row.

7. The CAM device of claim 1, Wherein the incremental charge circuit is further configured to partially pre-charge the match line to a threshold voltage of the match detector circuit during a pre-charge phase of the compare operation.

8. The CAM device of claim 7, wherein the incremental charge circuit comprises:
   a first pull-up transistor coupled between the match line and the second voltage, and having a gate responsive to a first pre-charge signal; and
   a second pull-up transistor coupled between the match line and the second voltage, and having a gate responsive to a logical combination of a second pre-charge signal and the feedback signal.

9. The CAM device of claim 7, wherein the incremental charge circuit comprises:
   a first pull-up transistor coupled between the match line and the second voltage, and haying a gate responsive to a logical combination of a first pre-charge signal and a logical complement of the feedback signal; and
   a second pull-up transistor coupled between the match line and the second voltage, and having a gate responsive to a logical combination of a second pre-charge signal and the feedback signal.

10. The CAM device of claim 9, wherein the first pull-up transistor is configured to pre-charge the match line in response to assertion of the first pre-charge signal until the feedback signal indicates the match line voltage exceeds the threshold voltage.

11. The CAM device of claim 10, wherein the second pull-up transistor is configured to charge the match line towards the second voltage in response to assertion of the second pre-charge signal only when the feedback signal indicates the match line voltage exceeds the threshold voltage.

12. The CAM device of claim 1, wherein the incremental charge circuit comprises:
   a partial pre-charge circuit, the partial pre-charge circuit comprising:
      a first pull-up transistor coupled between the match line and the second voltage; and
      a first control circuit having first and second inputs configured to receive a first pre-charge signal and the feedback signal, respectively, and having an output coupled to a gate of the first pull-up transistor.

13. The CAM device of claim 12, wherein the first control circuit is configured to partially pre-charge the match line when the first pre-charge signal is asserted to indicate a pre-charge phase and the feedback signal is de-asserted to indicate that the match line voltage does not exceed a threshold voltage of the match detector circuit.

14. The CAM device of claim 12, wherein the first control circuit comprises:
   a third input configured to receive a calibration signal that is indicative of a calibration mode.

15. The CAM device of claim 14, wherein the first control circuit is configured to ignore the feedback signal when the calibration signal indicates the calibration mode.

16. The CAM device of claim 12, wherein the incremental charge circuit comprises: a full charge circuit, the full charge circuit comprising:
   a second pull-up transistor coupled between the match line and the second voltage; and
   a second control circuit having inputs configured to receive a second pre charge signal and the feedback signal, and having an output coupled to a gate of the second pull-up transistor.

17. The CAM device of claim 16, Wherein the second control circuit is configured to charge the match line towards the second voltage when the second pre-charge signal is asserted to indicate the evaluation phase and the feedback signal is asserted to indicate that the match line voltage exceeds the threshold voltage.

18. The CAM device of claim 1, wherein the match detector circuit is configured to sense the match line voltage when a match clock is at a first level and not to sense the match line voltage when the match clock is at a second level.

19. A content addressable memory (CAM) device including a plurality of rows, wherein a respective row from among the plurality of rows comprises:
   a plurality of CAM cells coupled to a match line;
   a match detector circuit, coupled to the match line, configured to generate a feedback signal indicative of a match line voltage; and
   a charge circuit configured to partially pre-charge the match line to an intermediate voltage and to selectively charge the match line higher toward a supply voltage that is greater than the intermediate voltage when the feedback signal indicates a match condition between a search key and data stored in the respective row, the charge circuit comprising:
      a first pull-up transistor coupled between the match line and the supply voltage and having a gate responsive to a first pre-charge signal; and a second pull-up transistor coupled between the match line and the supply voltage and having a gate responsive to a logical combination of the feedback signal and a second pre-charge signal.

20. The CAM device of claim 19, wherein the intermediate voltage corresponds to a threshold voltage of the match detector circuit.

21. The CAM device of claim 19, wherein the first pull-up transistor is configured to partially pre-charge the match line to the intermediate voltage when the first pre-charge signal is asserted, and
wherein the second pull-up transistor is configured to charge the match line toward the supply voltage when the second pre-charge signal is asserted and the feedback signal is asserted.

22. The CAM device of claim 21, wherein the match detector circuit is configured to de-assert the feedback signal when the match line voltage is less than the intermediate voltage, and
wherein the match line detector circuit is configured to assert the feedback signal when the match line voltage exceeds the intermediate voltage.

23. The CAM device of claim 19, wherein the first pull-up transistor is configured to partially pre-charge the match line during a pre-charge phase of a compare operation only when the feedback signal indicates that the match line voltage is less than a threshold voltage of the match detector circuit, and
wherein the second pull-up transistor is configured to charge the match line higher during an evaluation phase of the compare operation only when the feedback signal indicates the match condition.

24. The CAM device of claim 23, wherein the second pull-up transistor is configured not to charge the match line higher towards the supply voltage when there is a mismatch condition for between the search key and the data stored in the respective row.

25. The CAM device of claim 19, wherein the charge circuit further comprises:
a third pull-up transistor coupled between the match line and the supply voltage and having a gate tied to a predetermined voltage that maintains the third pull-up transistor in a conductive state.

26. The CAM device of claim 19, wherein the first pull-up transistor is further responsive to a calibration signal that is indicative of a calibration mode.

27. The CAM device of claim 26, wherein the first pull-up transistor is configured to ignore the feedback signal when the calibration signal indicates the calibration mode.

28. The CAM device of claim 19, wherein the charge circuit comprises:
an input configured to receive a valid bit indicating whether the respective row contains valid data.

29. The CAM device of claim 27, wherein the charge circuit is configured to charge the match line only when the valid bit is asserted to indicate that the valid data is stored in the respective row.

30. A content addressable memory (CAM) device including an array having a plurality of rows, wherein a respective row from among the plurality of rows comprises:
a plurality of CAM cells coupled to a match line;
a match detector circuit, coupled to the match line, configured to generate a feedback signal indicative of a match line voltage; and
an incremental charge circuit configured to charge the match line from a first voltage to a second voltage that is greater than the first voltage only during an evaluation phase of a compare operation when the feedback signal indicates a match condition between a search key and data stored in the respective row.

* * * * *

UNITED STATES PATENT AND TRADEMARK OFFICE
CERTIFICATE OF CORRECTION

| | | |
|---|---|---|
| PATENT NO. | : 8,913,412 B1 | Page 1 of 1 |
| APPLICATION NO. | : 13/306896 | |
| DATED | : December 16, 2014 | |
| INVENTOR(S) | : Khanna et al. | |

It is certified that error appears in the above-identified patent and that said Letters Patent is hereby corrected as shown below:

In the Claims

Column 15, line 43, Claim 7, Delete "Wherein" and insert --wherein--.

Column 16, line 41, Claim 17, Delete "Wherein" and insert --wherein--.

Column 16, lines 59-60, Claim 19, Delete "to selectively charge" and insert --to charge--.

Column 16, line 60, Claim 19, Delete "line higher toward" and insert --line toward--.

Signed and Sealed this
Twenty-first Day of April, 2015

Michelle K. Lee
*Director of the United States Patent and Trademark Office*